United States Patent [19]
Chiu

[11] Patent Number: 6,011,301
[45] Date of Patent: Jan. 4, 2000

[54] STRESS REDUCTION FOR FLIP CHIP PACKAGE

[75] Inventor: Anthony Chiu, Richardson, Tex.

[73] Assignee: STMicroelectronics, Inc., Carrollton, Tex.

[21] Appl. No.: 09/094,135

[22] Filed: Jun. 9, 1998

[51] Int. Cl.[7] .................................................. H01L 23/02
[52] U.S. Cl. .......................... 257/678; 257/731; 257/727; 257/738; 257/780; 361/758; 361/783; 361/765
[58] Field of Search ..................................... 257/618, 620, 257/622, 625, 678, 687, 707, 731, 732, 733, 738, 747, 778, 787, 726, 727, 713, 774, 683, 780; 361/720, 765, 783, 758

[56] References Cited

U.S. PATENT DOCUMENTS

| | | | |
|---|---|---|---|
| 5,136,366 | 8/1992 | Worp et al. | 257/687 |
| 5,657,207 | 8/1997 | Schreiber et al. | 361/774 |
| 5,703,405 | 12/1997 | Zeber | 257/777 |
| 5,786,988 | 6/1998 | Harari | 257/618 |

*Primary Examiner*—Tom Thomas
*Assistant Examiner*—Luan Thai
*Attorney, Agent, or Firm*—Michael J. Buchenhorner; Theodore E. Galanthay; Lisa K. Jorgenson

[57] ABSTRACT

The bond between a flip chip integrated circuit and a substrate is subject to mechanical stress from thermal cycles. This problem is exaggerated when the substrate has a rate of thermal expansion which is appreciably different from that of silicon. This problem is further exaggerated when the IC has a large footprint because it will experience a larger absolute expansion. A solution is proposed to this problem which involves creating an anchoring point. The anchoring point can be in either the IC or the substrate and can be a through-hole or a surface indentation such as a groove or a cutout. The anchoring point is filled with the underfill material during the underfill process. The anchoring point thus provides additional mechanical strength to the bond between the IC and the substrate.

14 Claims, 13 Drawing Sheets

STRESS REDUCTION FOR FLIP CHIP PACKAGE

CROSS REFERENCE TO RELATED APPLICATIONS

Not applicable.

BACKGROUND OF THE INVENTION

1. Field of the Invention

The invention disclosed broadly relates to the field of integrated circuits, and more particularly relates to the field of assembly technologies for IC flip chip packages. The invention provides a mechanism for reducing the incidence of delamination due to thermal cycling stress.

2. Description of the Prior Art

The standard method of connecting integrated circuits ("ICs") to a substrate uses conventional wire-bonding technology. The IC is glued, or otherwise fixed, to the substrate with the circuit facing up and away from the substrate. Perimeter gold wire is then typically used to connect the circuit to the substrate.

An alternative to the standard interconnect method is flip chip technology. With a flip chip the IC is turned over ("flipped") so that the circuit faces the substrate. Circuit connections can now be accessed directly on the face and do not need to be routed to the perimeter of the IC. The classic method of interconnecting the circuit to the substrate is with solder bumps. Other methods include tape-automated bonding, wire interconnects, isotropic and anisotropic conductive adhesives, metal bumps, compliant bumps, and pressure contacts.

Flip chip provides a number of significant advantages over the conventional approach. These advantages include: shorter leads, no wire bonding, reduced chip wiring costs, lower noise, lower inductance, higher speed, higher i/o density, higher circuit density, smaller device footprint, and lower profile. In particular, power and ground routing is simplified because they can be accessed directly off of the substrate in multiple locations. FIG. 1 shows a typical die surface 100 with solder bumps 102. Many other arrays of solder bumps are possible and available.

Typically, the back or top side of the flip chip is exposed. High temperature applications, however, often cover the top of the flip chip with a heat sink. Applying a heat sink directly to the silicon is more thermally efficient than applying a heat sink to the outside of a plastic encapsulation.

In a solder bump flip chip assembly, the solder is typically deposited on the IC and the IC is then placed onto the substrate. The substrate in flip chip assemblies is typically a printed circuit board. This placement can be done, for instance, with a split-beam optical alignment system. FIG. 2 shows a cross-sectional view of an IC 202 with solder bumps 102. The IC 202 is first shown alone, and then shown mated to a substrate 206. The solder bumps 102 provide the electrical connection between the circuit on the IC 202 and the substrate 206. It also provides a modicum of mechanical strength, but the solder bonds are typically not very strong.

If the IC and the substrate have different rates of thermal expansion, then mechanical stress will occur as the device cycles between room temperature and operating temperature. These cycles are commonly referred to as thermal shock cycles or thermal stress cycles. Silicon has a rate of thermal expansion of roughly 3–4 ppm/degree C. Ceramic, a common substrate material, has one of roughly 6 ppm/degree C. The problem is exaggerated with less expensive substrate materials such as fiberglass which has a thermal expansion rate of roughly 17 ppm/degree C.

The problem is further exaggerated for devices with a larger footprint. Because the expansion is per unit length, or unit area, in larger devices the thermal expansion produces larger absolute values of expansion over the footprint of the device. The solder bumps for larger devices are said to be at a larger distance from the neutral axis. It follows that the solder bumps in the corners of the IC, assuming a square or rectangular footprint and solder bump array, will be under the greatest stress. These corner solder bumps are, in practice, the first ones to separate from the substrate.

To provide greater mechanical strength and adhesion during the stress cycles, a process known as underfill is commonly used. After soldering the IC to the substrate, an epoxy resin, or other material, is inserted into the space between the IC and the substrate and it acts as a glue. In addition to being inserted into the space, surface tension produces a capillary action between the IC and the substrate which pulls the epoxy into the space. The epoxy is also pulled up along the sides of the IC by the surface tension. FIG. 3 shows another cross-sectional view of the IC 202 with solder bumps 102. As in FIG. 2, the IC 202 is first shown alone, and then shown mated to the substrate 206. The mated portion also shows a layer of underfill 302 applied between the IC 202 and the substrate 206. To make the mechanical bond of the epoxy even stronger, it is possible to roughen up the surface of the substrate or the IC, chemically for instance, before applying the epoxy underfill.

This underfill process provides more strength to the device, but the weak point is still in the corners because they are farthest from the neutral axis. After a sufficient number of thermal stress cycles, the device can acquire a deformed shape, as shown in FIG. 4. As is illustrated, the solder bumps 402 which are in or near the corners are separated from the substrate 206 and are thus no longer making electrical contact. It is also possible for the solder bumps to break contact with the IC 202 as the IC 202 and the substrate 206 pull away from each other. FIGS. 5 and 6 show acoustic images of the separation between the IC and the substrate at the corners of the IC. The lighter shade indicates the separation.

As suggested earlier, this problem is exaggerated for larger ICs. The problem is also exaggerated because fiberglass and other inexpensive materials with high rates of thermal expansion are becoming popular substrate materials. Accordingly, there is a need for a method and apparatus for overcoming these problems.

SUMMARY OF THE INVENTION

Briefly, according to one aspect of the invention, an IC for use on a substrate comprises a circuit and an anchoring point. The circuit comprises circuit connections for connecting to the substrate. The anchoring point provides mechanical strength to a bond between the IC and the substrate.

Briefly, according to another aspect of the invention, a method for making an IC for use on a substrate comprises the steps of placing a circuit on the IC and making an anchoring point. The circuit contains circuit connections for connecting to the substrate. The anchoring point provides mechanical strength to a bond between the IC and the substrate.

DETAILED DESCRIPTION OF A PREFERRED EMBODIMENT

Figure 1:
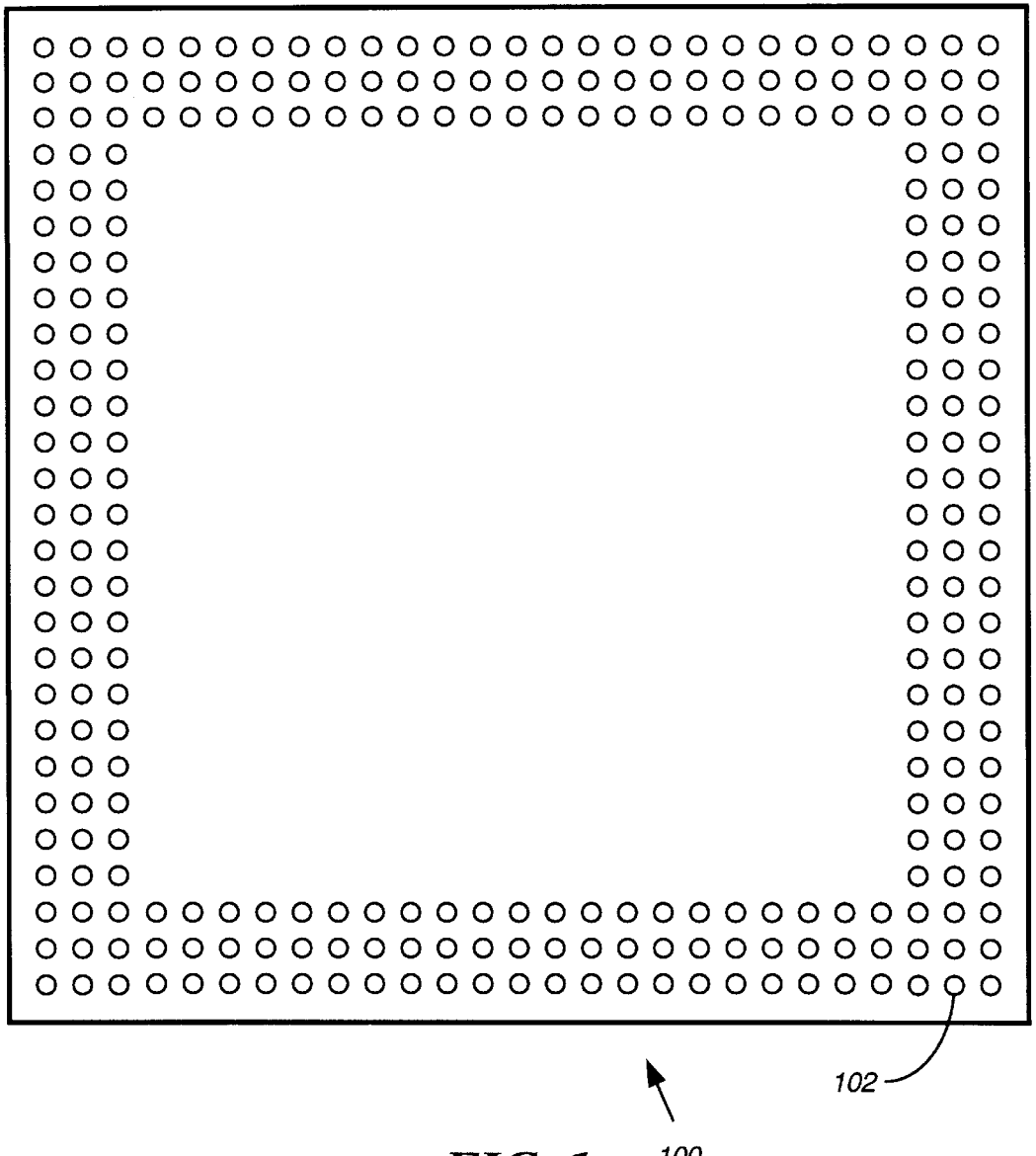
FIG. 1 is a bottom view of a flip chip IC surface with solder bumps, according to the prior art.
Figure 2:
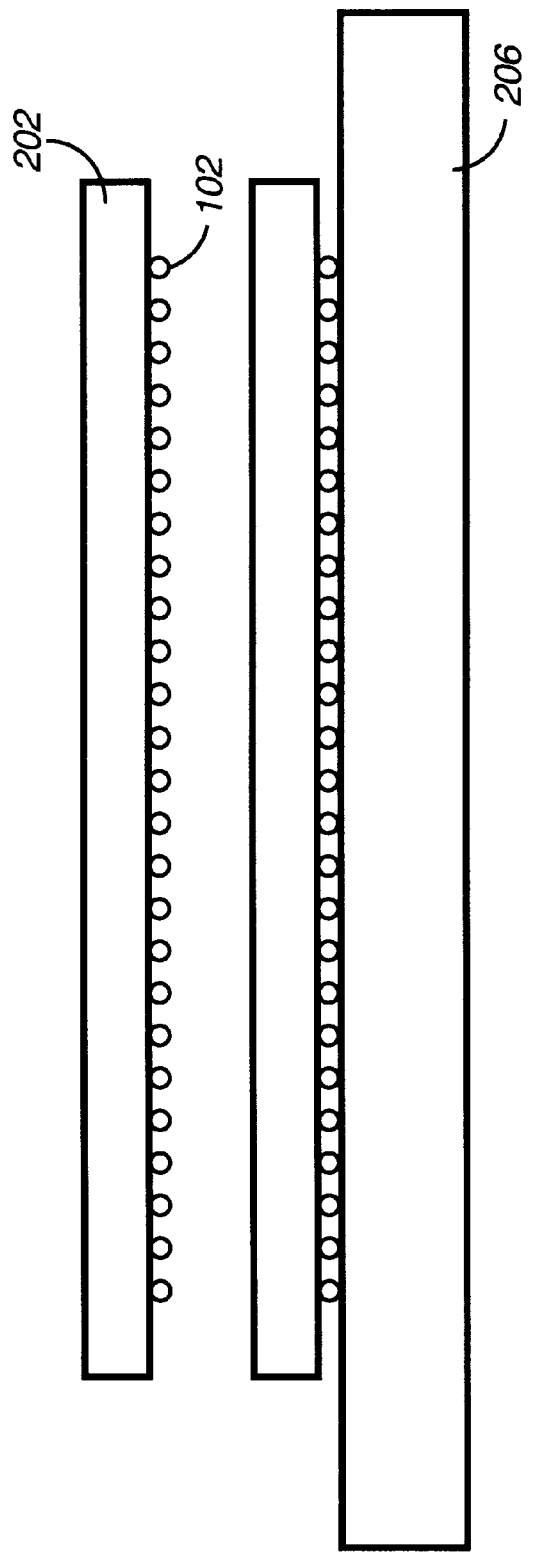
FIG. 2 is a cross-sectional view of the flip chip IC of FIG. 1, first alone and then connected to a substrate such as a printed circuit board.
Figure 3:
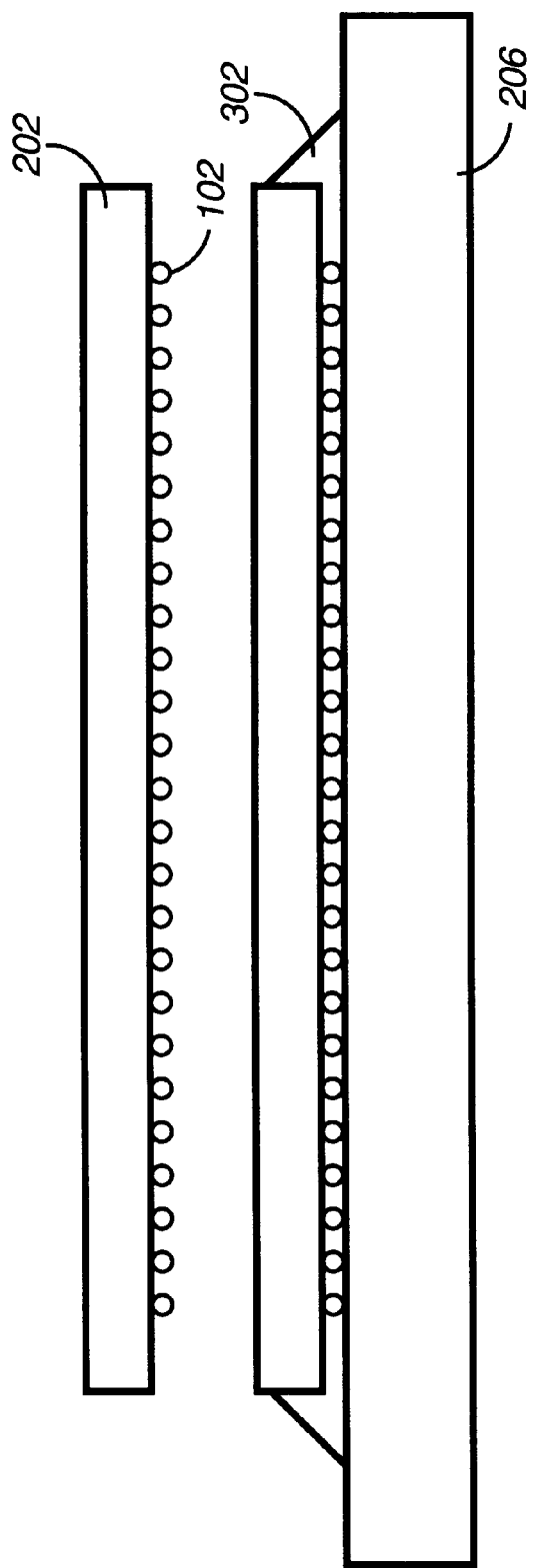
FIG. 3 is FIG. 2 with a layer of underfill shown between the flip chip IC and the substrate.
Figure 4:
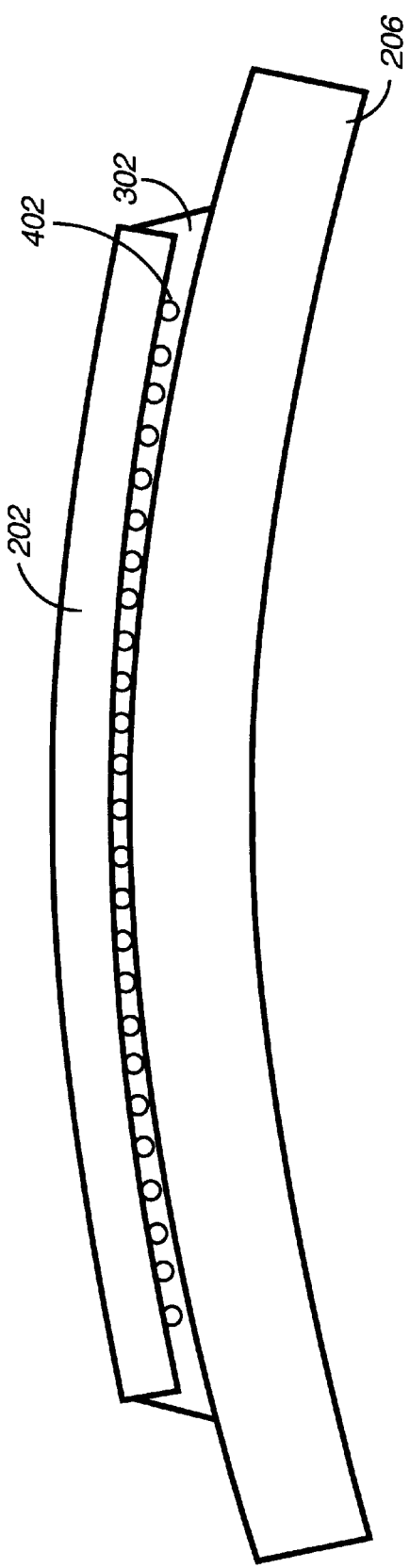
FIG. 4 a cross-sectional view of the flip chip IC connected to the substrate, showing the effects of thermal stress.
Figure 5:
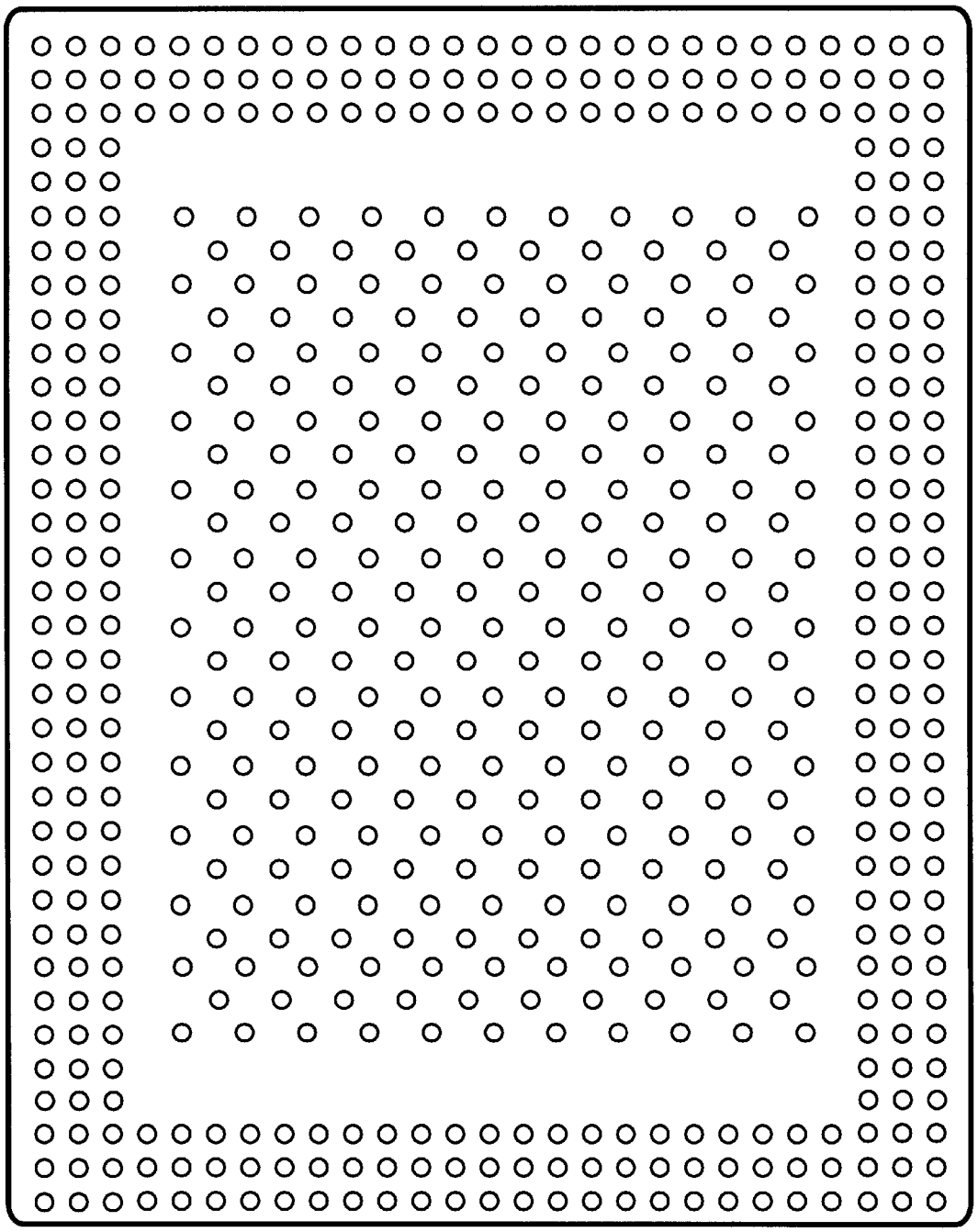
FIG. 5 is an acoustic image of the top view of a flip chip IC on a circuit board with the IC showing the effects of thermal stress.
Figure 6:
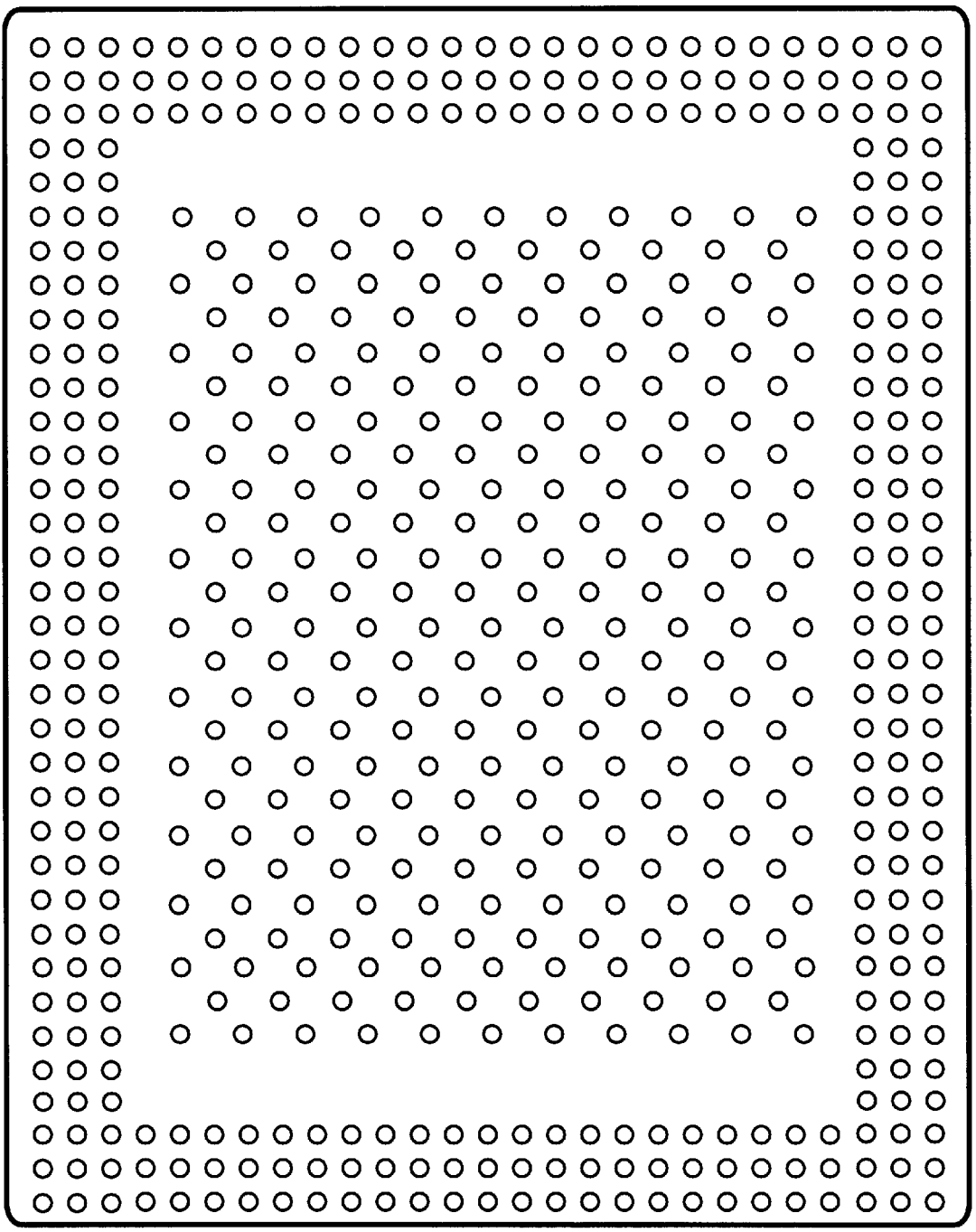
FIG. 6 is another acoustic image of the top view of a flip chip IC on a circuit board with the IC showing the effects of thermal stress.
Figure 7:
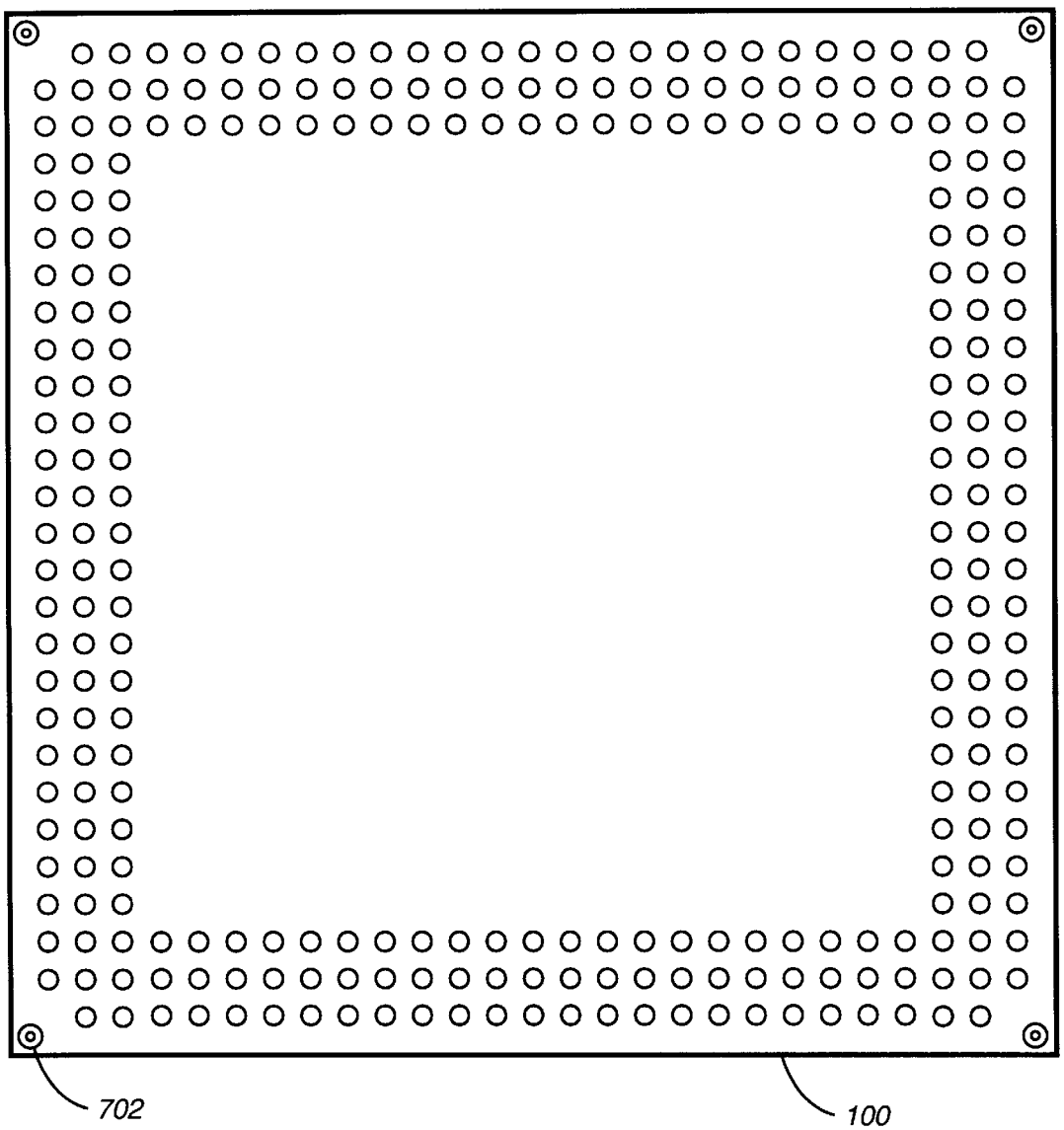
FIG. 7 is a bottom view of a flip chip IC surface with solder bumps, showing anchoring points according to the present invention.
Figure 8:
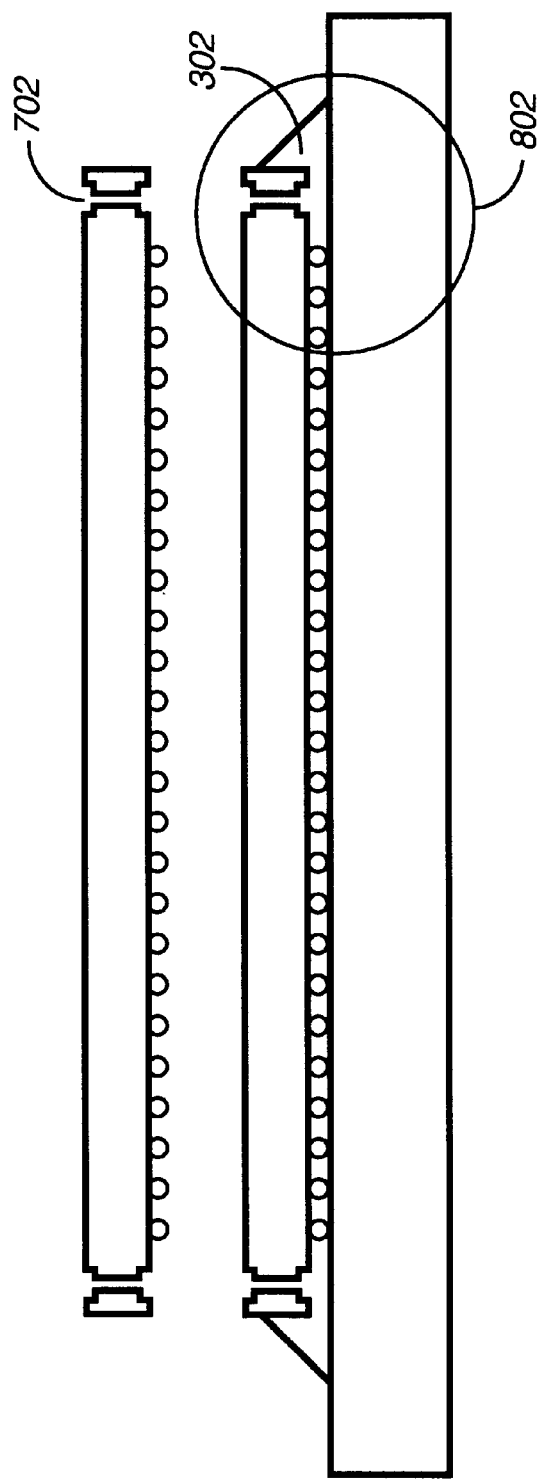
FIG. 8 is a cross-sectional view of the flip chip IC of FIG. 7, first alone and then connected to a substrate such as a printed circuit board, and showing two of the anchoring points according to the present invention.
Figure 9:
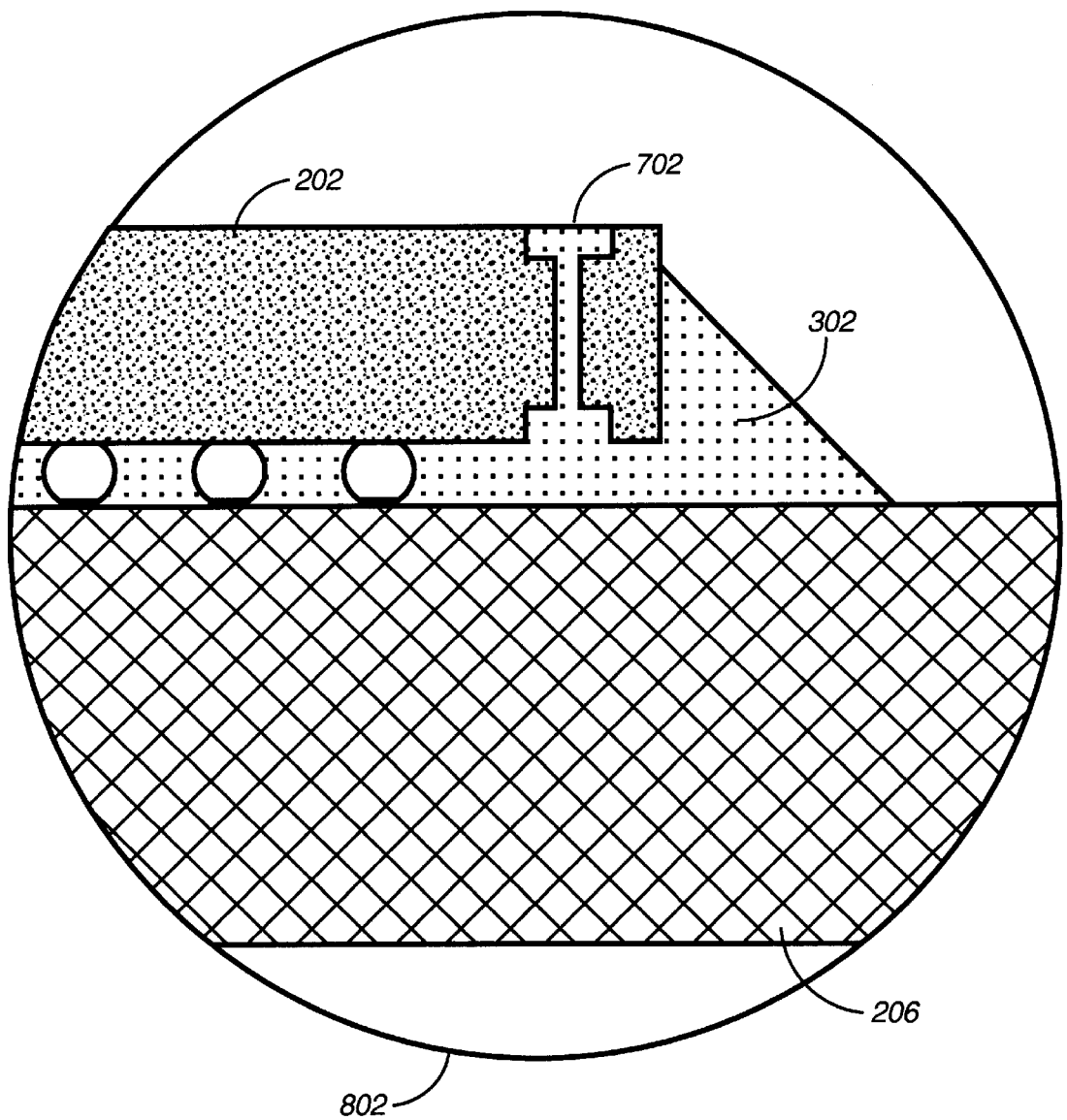
FIG. 9 is an exploded cross-sectional view of a portion of FIG. 8 showing the underfill material filling an anchoring point.

The problems associated with current flip chip assemblies can be remedied, at least partially, by anchoring the IC to the underfill layer. FIG. 7 shows the IC surface 100 with a hole 702 in each corner. FIG. 8 shows a cross-sectional view of the holes 702 and highlights a circular area 802 that is exploded in FIG. 9. FIG. 9 shows the underfill layer 302 filling the hole 702, and thereby providing an anchor.

The hole 702 can be more generally referred to as an anchoring point. An anchoring point can have virtually any shape and size. The preferred embodiment, shown in FIGS. 7–9, employs a cylindrical region with a top view of a circle, in which the anchoring point operates like a rivet. The placement of the anchoring points in the corners is effective in providing strength because the stress is greatest at the corners, as explained earlier. Other embodiments could employ an anchoring point with a top view of a rectangle, of an L-shaped region in a corner, or of an arc placed in a corner, all of which could go all the way through the IC. The anchoring points need not protrude all the way through the IC, however, to be effective.

Figure 10:
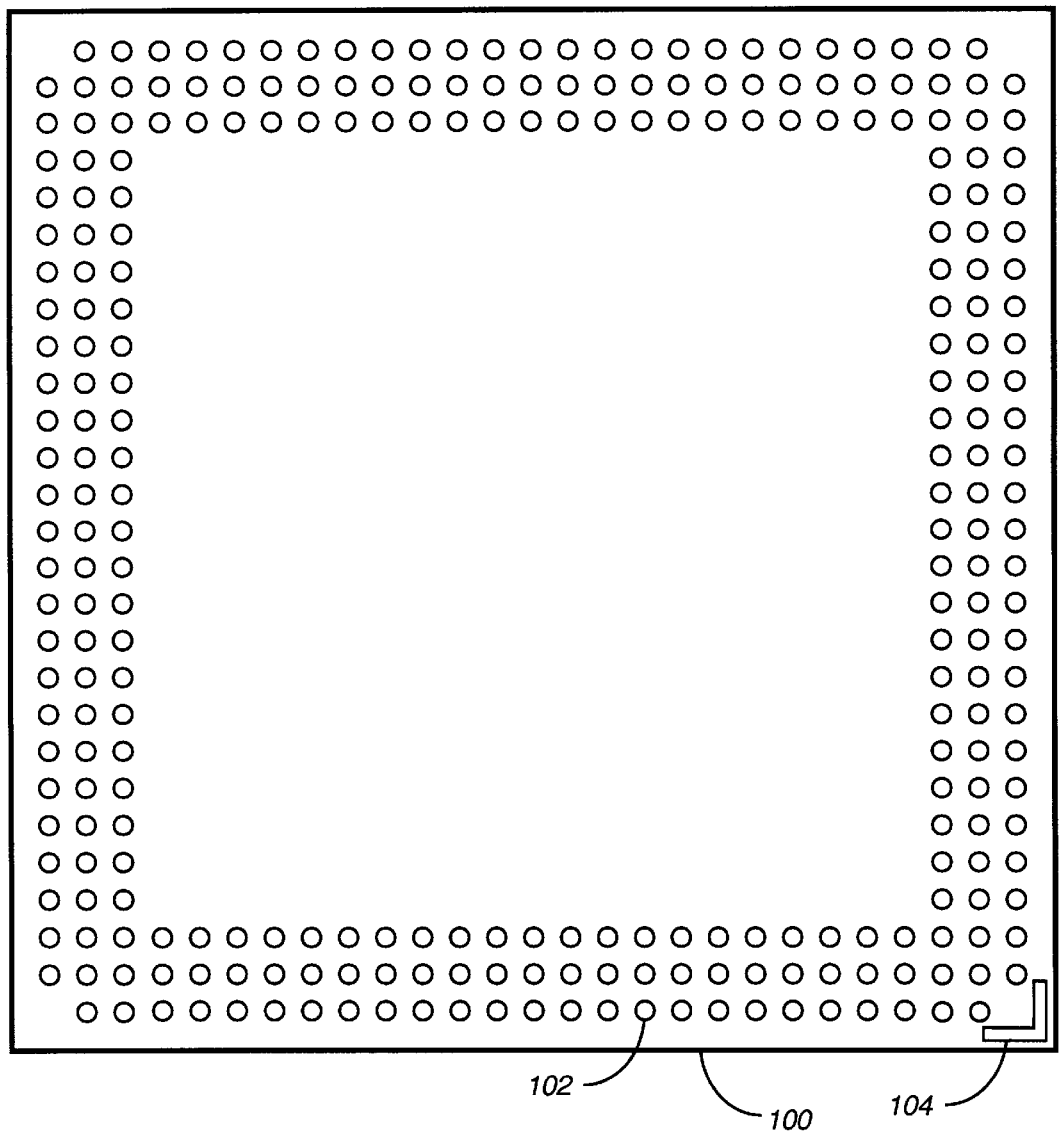
FIG. 10 is a bottom view of a flip chip IC surface with solder bumps, showing a surface indentation according to the present invention.
Figure 11:
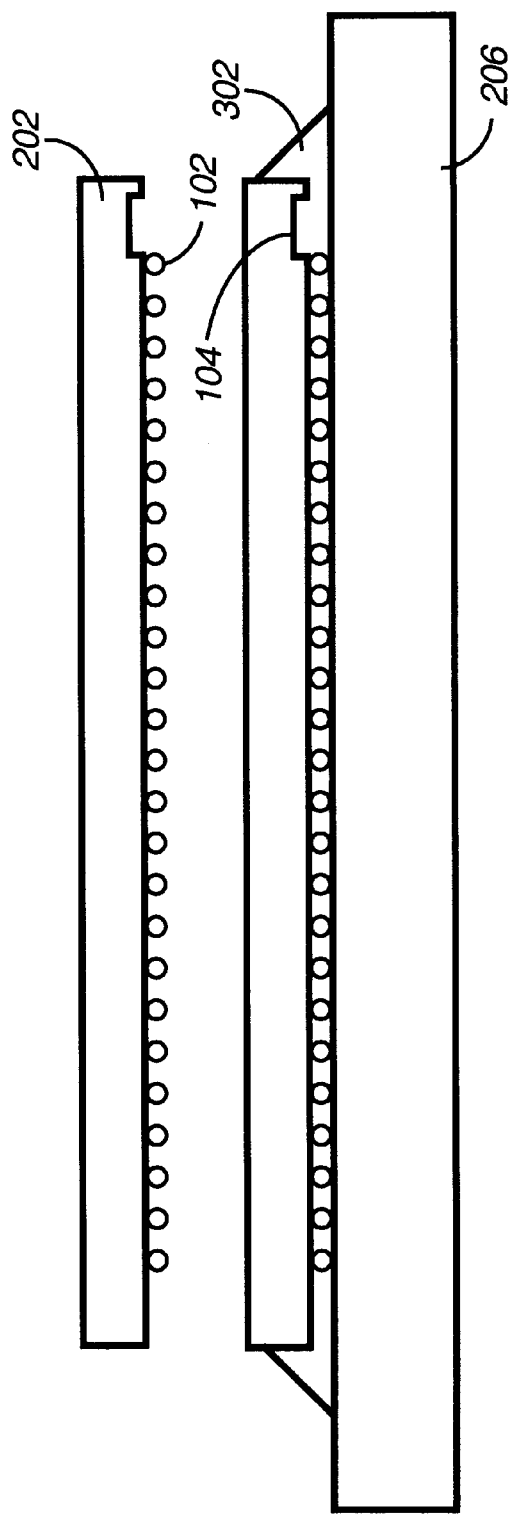
FIG. 11 is a cross-sectional view of the flip chip IC of FIG. 10, first alone and then connected to a substrate such as a printed circuit board.

Such alternate anchoring points include grooves and other surface indentations. These would operate more like a peg than a rivet. The surface indentation could be spherical, conical, or any other shape that provides a vector component of lateral stability to the boundary between the underfill and the IC. FIGS. 10 and 11 show an IC 202, with solder bumps 102 on the circuit face 100, having an L-shaped rectangular groove 104. The groove 104 has two legs which run along two of the sides of the IC 202 near the perimeter of the IC 202 and which join near the corner formed by those two sides. As FIG. 11 indicates, the groove 104 will be filled by the underfill layer 302, thus providing the additional mechanical strength. FIGS. 10 and 11 are for illustrative purposes, and a practical application would likely include similar grooves in the remaining three corners.

Figure 12:
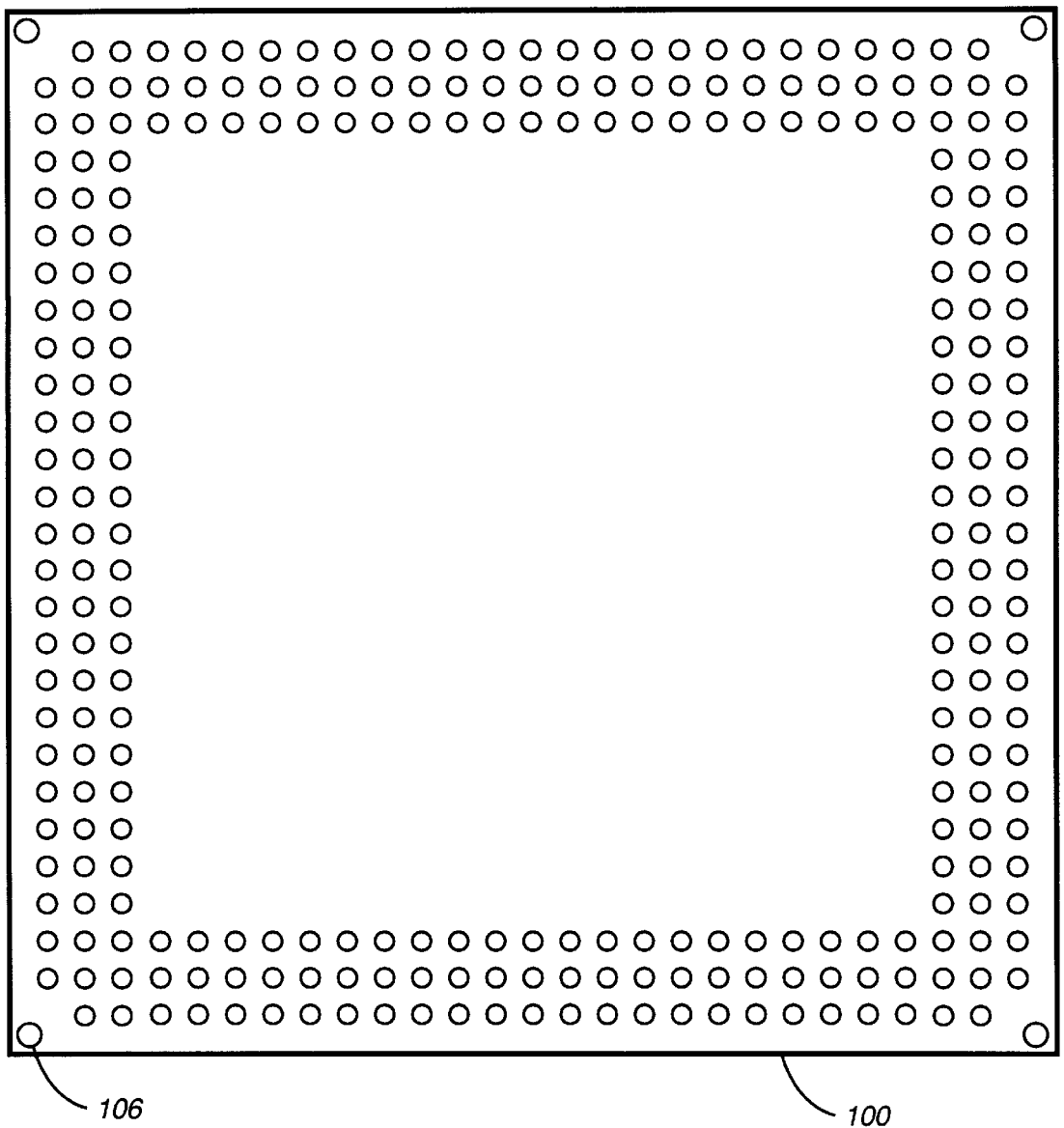
FIG. 12 is a bottom view of a flip chip IC surface with solder bumps, showing anchoring points according to the present invention.
Figure 13:
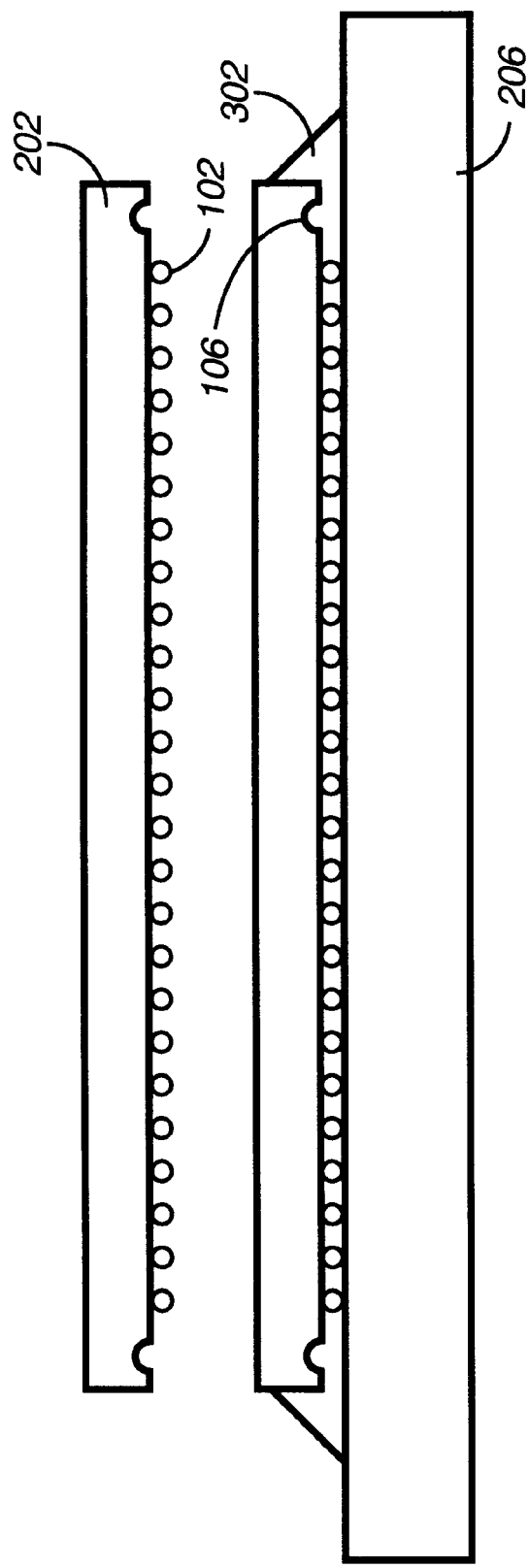
FIG. 13 is a cross-sectional view of the flip chip IC of FIG. 12, first alone and then connected to a substrate such as a printed circuit board.

Another embodiment of a surface indentation is shown in FIGS. 12 and 13. In this case, the surface indentation 106 is a hemispherically shaped cutout on the circuit face of the flip chip IC 202. The dome-shaped surface indentation 106 is also filled with the underfill layer 302 to provide the additional strength to the bond between the IC 202 and the substrate 206. A typical depth for such a surface indentation is roughly 100 microns for a flip chip IC having a thickness of roughly 780 microns (30 mils). The surface indentation can be made with a chemical etching process. As this example indicates, a surface indentation comprises more than the common practice of merely roughing up the surface of the IC. It involves placing specific anchoring points on the IC, or on the substrate.

The preferred embodiment involves a three step process to make a hole all the way through the IC. In the first step, a tap hole of small diameter is laser drilled all the way through the IC from the circuit side. In the second and third steps, the tap hole is counter bored from each side to make a larger diameter. The counter bores, however, do not go all the way to the middle of the IC. A space is left in the middle of the cylinder where the diameter is narrower than the counter bore diameter. FIGS. 7–9 show the two diameters of the anchor points of the preferred embodiment. The hole is then filled during the underfill process, as indicated in FIG. 9. Again, the capillary action helps draw the epoxy resin up through the hole. The preferred embodiment is expected to add roughly two to four years to the life of the device.

It is also possible to make an anchoring point in the substrate in addition to, or in lieu of, making an anchoring point in the IC. In the preferred embodiment, the underfill material is an epoxy resin that reacts with the substrate, which is a fiberglass printed circuit board. The reaction forms a bond between the epoxy and the board that is roughly twice as strong as the bond between the epoxy and the silicon in the IC. For this reason, it was more important to provide an anchor between the epoxy and the IC than between the epoxy and the board. However, alternate embodiments could provide an anchor in both materials if the additional strength provides greater reliability. Additionally, other embodiments may use different underfill materials and different substrate materials which may not form as strong a bond.

Although the embodiments discussed have all involved solder bumps as the method for electrically connecting the IC to the substrate, anchoring points can be employed with other types of flip chip technologies. Further, anchoring points could also be used with other types of interconnect technology aside from flip chip assemblies.

For example, with molded chip assemblies the IC also needs to be attached to the plastic molding. A common failure pattern is shear stress, which also arises from thermal shock cycles. An anchoring point could be used to help decrease the incidence of this failure pattern.

Although a specific embodiment of the invention has been disclosed, it will be understood by those having skill in the art that changes can be made to this specific embodiment without departing from the spirit and scope of the invention. The scope of the invention is not to be restricted, therefore, to the specific embodiment, and it is intended that the appended claims cover any and all such applications, modifications, and embodiments within the scope of the present invention.

What is claimed is:

1. An integrated circuit ("IC") for use on a substrate, the IC comprising:
   a. a circuit with circuit connections for connecting to the substrate;
   b. a facing side, which is the side of the IC which is intended to face the substrate; and
   c. an anchoring point for use in providing mechanical strength to a bond between the IC and the substrate, the anchor point comprising a hole in the IC, and
   d. an underfill material that at least partially fills the hole and provides a bond between the IC and the substrate.

2. The IC of claim 1, wherein:
   a. the circuit and the circuit connections are contained on the facing side of the semiconductor chip, as in a flip chip assembly; and
   b. the circuit connections are distributed across the facing side of the semiconductor chip, as in a flip chip assembly, and not restricted to the perimeter of the semiconductor chip.

3. The IC of claim 2, wherein the hole protrudes all the way through the semiconductor chip.

4. The IC of claim 3, further comprising a plurality of holes, each of which is drilled near the perimeter of the semiconductor chip such that each hole is further from the center of the semiconductor chip than any of the circuit connections.

5. The IC of claim 4, wherein the underfill material comprises an epoxy underfill material that at least partially fills each of the holes and provides a bond between the semiconductor chip and the substrate.

6. The IC of claim 1, wherein the hole comprises a spherical indentation chemically etched in the face of the semiconductor chip which faces the substrate.

7. The IC of claim 1, wherein the anchoring point comprises a groove that is chemically etched in the facing side of the semiconductor chip.

8. The IC of claim 7, wherein the groove comprises two rectangular legs, each placed near the perimeter of separate sides of the semiconductor chip and which join in the corner formed by the two sides.

9. A semiconductor device comprising:
   a. a semiconductor chip mounted on a substrate and the semiconductor chip comprising,
   b. an anchoring point comprising at least one hole in the semiconductor chip for anchoring the semiconductor chip to the substrate,
   wherein an underfill material is placed between the semiconductor chip and the substrate, the underfill material at least partially filling the hole.

10. The semiconductor device of claim 9, wherein:
    a. the IC is a flip chip IC;
    b. the substrate is a printed circuit board;
    c. the anchoring means comprises:
       i. an anchoring point; and
       ii. an underfill material placed between the IC and the printed circuit board.

11. The semiconductor device of claim 10, wherein:
    a. the IC comprises the anchoring point; and
    b. the anchoring point comprises a hole which is laser drilled all the way through the IC, wherein the anchoring point is located near the perimeter of the IC and is at least partially filled with the underfill material.

12. The semiconductor device of claim 10, wherein:
    a. the printed circuit board comprises the anchoring point; and
    b. the anchoring point comprises a square shaped surface indentation in the side of the printed circuit board that faces the IC, wherein the anchoring point does not protrude all the way through the printed circuit board and is at least partially filled with the underfill material.

13. The semiconductor device of claim 9, wherein:
    a. the substrate is part of a plastic molding;
    b. the anchoring means comprises:
       i. an anchoring point; and
       ii. a bonding material placed between the IC and the substrate.

14. The semiconductor device of claim 13, wherein:
    a. the IC comprises the anchoring point; and
    b. the anchoring point comprises a hole which is laser drilled all the way through the IC, wherein the anchoring point is located near the perimeter of the IC and is at least partially filled with the bonding material.

* * * * *